United States Patent [19]

Delawski et al.

[11] Patent Number: 5,210,425

[45] Date of Patent: May 11, 1993

[54] ETCHING OF NANOSCALE STRUCTURES

[75] Inventors: Edward J. Delawski, Newark, Del.; Bruce A. Parkinson, Fort Collins, Colo.

[73] Assignee: E. I. du Pont de Nemours and Company, Wilmington, Del.

[21] Appl. No.: 718,084

[22] Filed: Aug. 30, 1991

[51] Int. Cl.$^5$ .......................................... H01J 37/305
[52] U.S. Cl. ................................ 250/492.2; 250/307; 365/151
[58] Field of Search ............... 250/307, 492.2; 369/126; 365/151; 73/105

[56] References Cited

U.S. PATENT DOCUMENTS

| | | | |
|---|---|---|---|
| 4,724,318 | 2/1988 | Binnig | 250/306 |
| 4,987,312 | 1/1991 | Eigler | 250/492.2 |
| 5,021,672 | 6/1991 | Parkinson | 250/492.2 |
| 5,138,174 | 8/1992 | Tang | 250/492.2 |

OTHER PUBLICATIONS

Weisenhorn et al., *Biophys. J.*, vol. 58, pp. 1251–1258, Nov. (1990).
Weisenhorn et al., *Science*, vol. 247, pp. 1330–1333, Mar. 16, 1990.
Wickramasinghe, H. K., *Scientific American*, pp. 98–105, Oct. (1989).
Hansma et al., *Science*, 242, Oct. 14, 1988, pp. 209–216.
Gould et al., *J. Vac. Sci. Technol. A*, 8(1), Jan./Feb. (1990), pp. 369–373.
Rugar et al., *Physics Today*, pp. 23–30, Oct. (1990).

*Primary Examiner*—Jack I. Berman

[57] ABSTRACT

A process for etching with an atomic force microscope using a two-dimensional metal chalcogenide as the substrate, is disclosed.

13 Claims, 2 Drawing Sheets

ETCHING OF NANOSCALE STRUCTURES

FIELD OF THE INVENTION

The present invention relates to a process for the etching of one or more molecular layers from a substrate on a nanometer scale with an atomic force microscope by ablation of atoms rastered by the microscope tip.

BACKGROUND OF THE INVENTION

The atomic force microscope, hereinafter AFM, is an instrument capable of resolving surface detail down to the atomic level. The AFM provides topographic images by scanning a sharp stylus over a substrate surface. The microscope's tip, ideally terminating in a single atom, traces the contours of a surface with atomic resolution. In one mode of operation the tip is maneuvered to be in contact with the surface of a conducting or nonconducting substrate so that the atom at the probe tip senses the van der Waals interaction of the nearest atom of the sample. An image is generated by sensing the force on the tip as it is rastered over the surface. The instrument can be operated in one of two ways. Either the deflection of the cantilever tip is monitored as it interacts with surface features, or the cantilever tip deflection is kept constant and surface features are mapped by movement of the z piezoelectric element. The magnitude of the force applied by the tip to the sample can be estimated from the spring constant of the cantilever and the measured deflection. The image obtained by either mode of operation is a topographical map of the surface.

Further detail on the structure and operation of the AFM is disclosed in U.S. Pat. No. 4,724,318 of Binnig et al. issued Feb. 9, 1988; Wickramasinghe, H. K., *Scientific American*, October (1989) pp. 98–105; and Hansma et al., *Science* 242, October 14, 1988, pp. 209–216. The AFM has been used to image a wide variety of substances. See for example, Gould et al., *J. Vac. Sci. Technol. A*, 8(1), 369–373 (1990) and Ruger et al., *Physics Today*, 23–30, Oct. (1990).

The AFM is useful not only for the imaging or characterization of surfaces, but also for manipulating surfaces on a scale as small as subnanometers. Lithography using the AFM is of current interest in the area of electronics for information storage and in the design of transistors, diodes, integrated circuits and the like. The miniaturization of electronic components is increasing the speed of computers. The ability to manipulate single atoms or molecules with the AFM provides unique potential applications in microelectronics. Various approaches have been explored in the use of AFM for etching or writing.

Writing using the AFM wherein the microscope tip physically touches, scratches, indents, or creates holes in the substrate surface has been taught by Weisenhorn et al, *Biophys. J.*, Vol. 58, pp. 1251–1258, Nov. (1990). Surface-induced polymerization of actin filaments occurred, but a low force limitation for nondestructive imaging was found. The filaments could be manipulated or removed from the surface by the tip of the AFM.

Another approach to writing with the AFM has been to use high forces for surface rearrangement of the atoms already present. Weisenhorn et al., *Science*, Vol. 247, pp. 1330–1333, Mar. 16, 1990, disclose rearrangement of tert-butyl ammonium ions on a zeolite surface with the AFM tip by application of a sufficiently large force.

In the known methods of lithography using the AFM, the image cannot be viewed simultaneously with its creation, but is viewed afterwards. A post writing treatment is often required to stabilize the image. The substrate or writing surface is destructively deformed using many of the known techniques. Further the known techniques are not sufficiently reliable or reproducible to use in manufacturing applications.

It is therefore an object of the present invention to provide a process for etching using the AFM wherein the etched image can be viewed simultaneously with its creation.

It is a further object of the present invention to provide a lithography process using the AFM which requires no post writing treatment to stabilize the image.

It is a further object of the present invention to provide a lithography process using AFM which can controllably remove one molecular layer at a time.

It is a further object of the present invention to provide a process for etching using the AFM which does not destructively deform the substrate.

It is a further object of the present invention to provide a process for etching or writing using the AFM which is reliably reproducible.

It is a further object of the present invention to provide a process for etching or writing using the AFM wherein the depth of the etched structures are known to a precision of $(0.0003 \times n)$ nanometer, where n is the number of layers etched, and the bottom of the etched structures are atomically flat.

It is a further object of the present invention to provide a process for etching which can be controlled by controlling the force applied to the cantilever.

SUMMARY OF THE INVENTION

The present invention comprises a process for etching a nanoscale structure using an AFM comprising scanning the microscope tip over a two dimensional substrate of at least one metal chalcogenide at a force of $10^{12}$ to $10^{-6}$ newtons to generate the continuous controlled ablation of one or more molecular layers of the metal chalcogenide. The resulting removal of the atoms rastered by the microscope tip can be viewed simultaneously with the rastering, thereby providing selective control of the precise depth of ablation. A single molecular layer can be removed one or more atoms at a time.

The present invention further comprises a method for the determination of small deviations from stoichiometry comprising scanning with the AFM a substrate area of known size, counting the number of nucleation sites, and subtracting the number of nucleation sites from the number of atoms scanned.

DETAILED DESCRIPTION OF THE INVENTION

Figure 1:
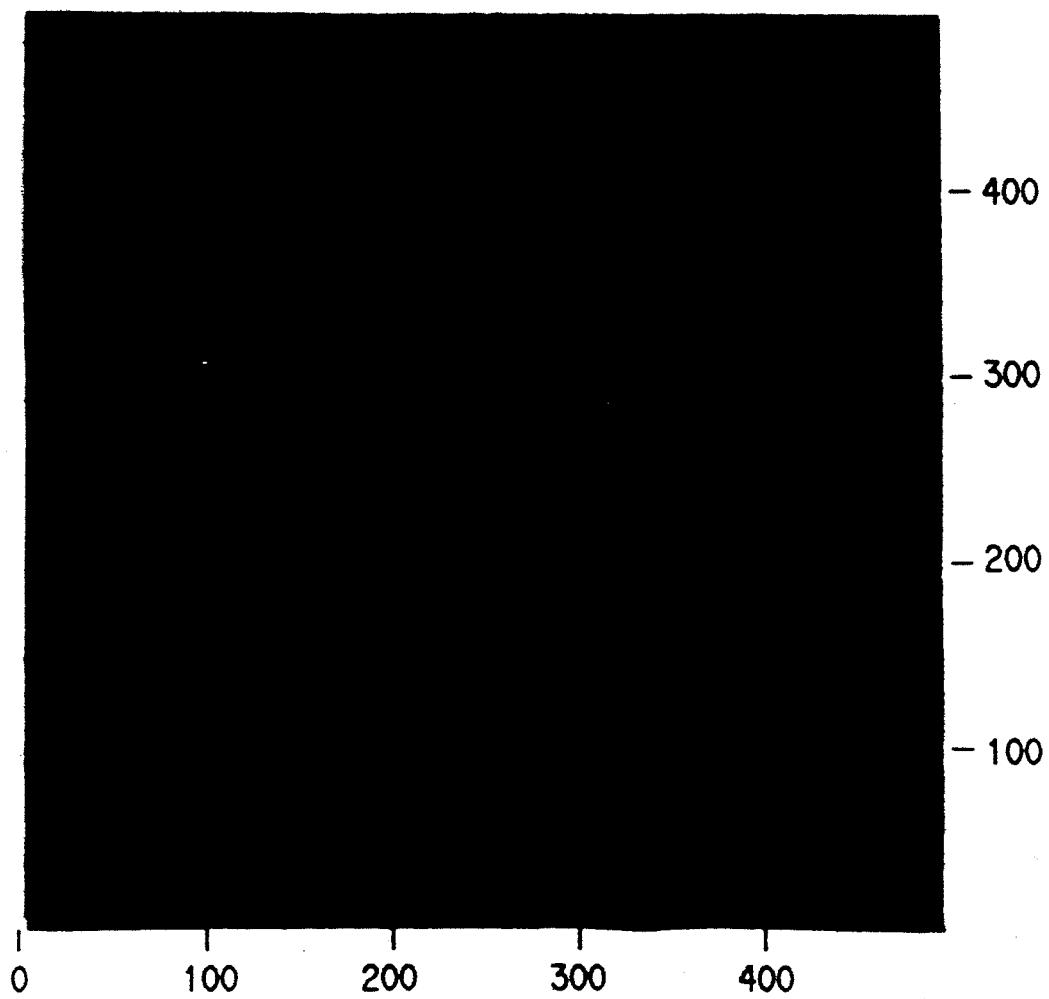
FIG. 1 is a depiction of the etched material resulting from Example 1.
Figure 2:
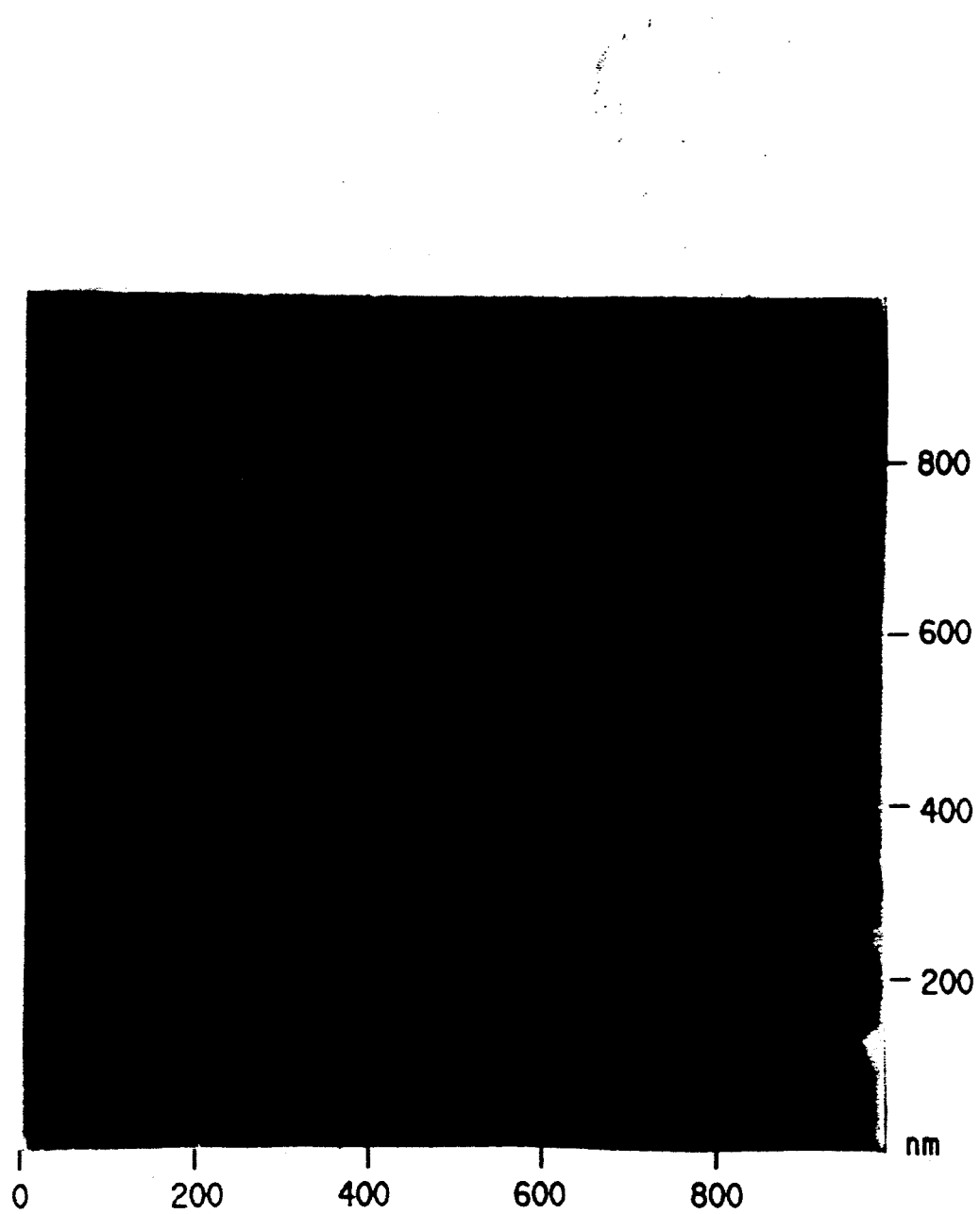
FIG. 2 ia a depiction of the etched material resulting from Example 2.

The term "etching" as used hereinafter shall mean the ablation of a single molecular layer from a substrate surface one or more atoms at a time.

The term "ablation" as used herein means the removal or disappearance of atoms leaving behind no residue of the individual atoms removed.

The term "AFM", as previously defined, means atomic force microscope, also referred to as scanning force microscope (SFM).

The term "holes" as used herein means the space left upon ablation of atoms of one or more molecular layers of a substrate, but does not necessarily denote that the entire thickness of the substrate has been penetrated.

The term "nucleation" as used herein means the initiation of hole growth.

The term "structure" as used herein means the etched image, figures, letters or drawings created by the process of the present invention.

The term "two dimensional substrate" as used herein means a material wherein the bonding is strongest in two dimensions which results in easy cleavage to expose atomically flat surfaces.

The present invention comprises a process for the continuous sequential etching of one or more molecular layers from a substrate on a nanometer scale with an AFM by ablation of atoms rastered by the microscope tip. Since the ablation can be viewed while etching, very precise control or manipulation of the scope and depth of the etching can be achieved in a reliably reproducible manner. The substrate is not destructively deformed. Further, no post writing treatment is required to stabilize the image.

In the process of the present invention the substrate can be etched one molecular layer at a time by removal of one or more atoms at a time in a very controlled fashion by scanning the force microscope over the surface, preferably in air, at typical values of applied force. Alternatively, more than one molecular layer can be ablated simultaneously. Structures at the nanometer scale can be generated, but the lower limit of resolution is yet to be determined. Shape is controlled with the raster pattern of the microscope and depth is accurately controlled by counting the number of molecular layers etched. By variation in the size and position of the raster pattern rather complex features can be produced.

During the etching process of the present invention, the ablation of atoms appears as the nucleation and growth of holes in one or more layers of the substrate as the microscope tip scans the substrate surface. The growth of holes can be made to continue until one entire molecular layer is removed whereupon the next layer begins to nucleate holes and the process repeats. Alternatively, more than one molecular layer can be nucleated and ablated simultaneously. The shape of the nucleated holes may depend upon the crystal structure of the substrate. For example, ablation of $NbSe_2$ results in the appearance of triangular shaped holes reflecting the trigonal prismatic coordination of the metal atom in the 2H polytype of $NbSe_2$.

In most cases the image of the substrate remains clear during the etching process, but it can become less clear during periods of rapid etching. Faster nucleation results in simultaneous ablation of more than one molecular layer in the rastered region. In general, sharp features and islands are etched more rapidly than smooth edges. However, the speed of etching is dependent upon the substrate used and the microscope tip. Analysis of the depth information in a constant force scan of an etched area usually reveals that the step heights observed are all multiples of the molecular layer thickness of the substrate being etched within experimental error. Therefore depth can be controlled by counting the step heights or molecular layers etched. For example, a typical depth of 0.5–0.8 nm per layer is measured when $SnSe_2$ is used as the substrate. Since X-ray crystallography shows the layer thickness of $SnSe_2$ is equal to $0.6134 \pm 0.0003$ nm, the depth of the etched structure can be known and controlled to a precision of $(0.0003 \times n)$ nanometer where n is the number of layers etched. Because typically one molecular layer at a time is removed, the bottom surface of the etching is atomically flat, which is an advantage in some practical applications of this technology.

The etching process of the present invention requires specific types of substrate as well as use of particular instrumental operating parameters. Substrates suitable for use in the process of this invention comprise metal chalcogenides having two dimensional bonding. Examples of such substrates include InSe, $ZrS_2$, $TiSe_2$, $SnSe_2$, $SnS_2$, $NbSe_2$, $TaS_2$, $MoSe_2$, $WSe_2$, and solid solutions thereof. The rate of etching from fastest to slowest for the various substrates is generally in the order listed above. The tungsten and molybdenum selenides etch slowly and only at rather high forces. Preferred substrates include InSe, $ZrS_2$, $TiSe_2$, $SnSe_2$, $SnS_2$, and $NbSe_2$. Most preferred for use herein are $SnSe_2$ and $NbSe_2$.

Molecular beam epitaxy can be used to fabricate layered structures by means of atomic or molecular beams. It allows atomic layer-by-layer deposition in a two dimensional growth process, resulting in the formation of crystalline materials of multiple or alternating thin layers of composition, each only a few atomic layers in thickness. See Ploog, K., Angewandte Chemie, Int'l Ed. in English, 27, 5, 593–758, May (1988), herein incorporated by reference. The structuring of solid materials using this technique provides new layered substrates to which the process of the present invention can be applied, so long as the top one or more layers are comprised of an etchable substrate. Substrates suitable for use as the top layer, or portion thereof, in such a material include the two dimensional metal chalcogenides as listed above. Such etchable substrates can be layered in any combination, or in combination with other substrates such as silicon or gallium arsenide. The process of the present invention can then be used to etch structures into these layered materials one or more molecular layers at a time to expose one or more of the underlying layers as desired. For example, exposure of silicon or gallium arsenide layers in particular patterns would be useful in the preparation of masks for small device fabrication.

Crystal perfection and purity are important factors in controlling the rate of nucleation and growth of holes during the etching process. Nucleation can occur at defects or dopant sites on the crystals. Highly defective crystals in some cases can result in the nucleation rate exceeding the hole expansion rate. When this occurs deep irregular features can result, but still showing clearly the multiple layers. The growth rate of holes appears to be the limiting factor with regard to size of the resulting etched figure or structure. An increase in the rate of etching can often be achieved by intentionally causing defects.

The rate of etching is affected not only by the substrate but also by the microscope tip or probe. Microscope tip morphology is important.

Instrument operating parameters suitable for use in the process of the present invention include a force of from about $10^{-12}$ to about $10^{-6}$ newtons. The preferred force is from about $10^{-10}$ to about $10^{-8}$ newtons.

An inert atmosphere can be employed but is not required in the process of the present invention. The etching can be conducted in an air atmosphere. A reduced pressure atmosphere is not needed in the present invention. Water vapor in the form of relative humidity aids the etching process.

One of the primary advantages of the process of the present invention is the ability to view the image simultaneously with its creation. Because the altered substrate can be viewed with certainty of its identity, the altered substrate can be used as a basis for attempting specific results dependent upon chemical bonding or atomic shape. Examples of potential uses include use of an etched substrate as a detector for specific molecules, as a site for stabilizing molecular forms, or as a site for specific reactions. Microelectronics and quantum well structures are areas of application. Other potential uses of the process of the present invention include data storage, preparation of masks for small device fabrication, etching of semiconductor and other substrates, or fabrication of transistor structures on the surface of materials.

The present invention further comprises a method for determination of small deviations from stoichiometry comprising scanning an area of substrate of defined size, counting the resulting nucleation sites, and subtracting the number of nucleation sites from the number of atoms scanned. For example, for $SnSe_{2-x}$, x can be determined for very small values. Scanning with the AFM an area of substrate of known size, such as one square micron of a $SnSe_{2-x}$, and counting the number of nucleation sites provides a count of the number of atoms removed by the scanning. Subtraction of the number of missing atoms from the number of original atoms scanned provides the value of x. This method is accurate to the parts per million level or better. Since it is a direct measurement at the atomic level, it is superior to conventional analytical techniques or to methods which rely on the indirect measurement of some property of the substrate. This method is useful for determination of small deviations in stoichiometry at a highly accurate level.

The following examples illustrate the present invention but are not intended to limit it in any manner.

EXAMPLE 1

A structure was etched on a $SnSe_2$ substrate by scanning a micromachine silicon cantilevered nanotip of a Nanoscope II AFM available from Digital Instruments of Santa Barbara, Calif., over its surface. The tip was repeatedly scanned over the same line until one molecular layer was removed. Then the scan orientation was rotated 90° and scanning was repeated until one molecular layer was removed. When the scan orientation was rotated 45° the "X" pattern was observed on the $SnSe_2$ surface According to the manufacturer's force calibration procedure, the average force applied to the surface using the point at which tip deflection first occurs as the zero rorce reference, was amount $6 \times 10^{-9}$ newtons. The scan rate was 19.53 Hz and 14.20 Hz (for the 90° rotation). Each line making up the "X" pattern was about 425 nm long, 20 nm wide, and 0.6 to 0.8 nm deep corresponding to the c-axis of the $SnSe_2$ unit cell. The time for the entire etching operation was about 6 minutes.

EXAMPLE 2

A square area was etched from a $SnSe_2$ surface by scanning a nanotip of a Nanoscope II AFM, available from Digital Instruments of Santa Barbara, Calif., over its surface in a raster pattern. The tip was scanned over the same area and nucleation and growth of holes were observed until one molecular layer was removed. According to the manufacturer's force calibration procedure, the average force applied to the surface, using the point at which tip deflection first occurs as the zero force reference, was about $71 \times 10^{-9}$ newtons. The scan rate was 19.53 Hz for the etching. The square etched measured about 500 nm across and about 6 nm deep, corresponding to the c-axis of the $SnSe_2$ unit cell.

EXAMPLES 3-6

The substrates listed in Table I were etched using a process similar to that described in Example 2.

TABLE I

| Example No. | Substrate | Relative Speed |
|---|---|---|
| 3 | $TaS_2$ | Rapid |
| 4 | $SnSe_2$ | Rapid |
| 5 | $NbSe_2$ | Moderate |
| 6 | $SnS_2$ | Slow, only when the surface is damaged |

What is claimed is:

1. A process for etching a nanoscale structure using an atomic force microscope comprising scanning the microscope tip over a two dimensional substrate of at least one metal chalcogenide at a force of from about $10^{-12}$ to about $10^{-6}$ newtons to generate the controlled ablation of one or more molecular layers of the metal chalcogenide.

2. The process of claim 1 wherein a single molecular layer is ablated.

3. The process of claim 1 wherein more than one molecular layer is ablated simultaneously.

4. The process of claim 1 wherein the metal chalcogenide comprises InSe, $ZrS_2$, $TiSe_2$, $SnSe_2$, $SnS_2$, $NbSe_2$, $TaS_2$, $MoSe_2$, or $WSe_2$ or solid solutions thereof.

5. The process of claim 4 wherein the metal chalcogenide comprises $SnSe_2$, $NbSe_2$, $SnS_2$, or $TaS_2$.

6. The process of claim 1 wherein the substrate comprises a layered material prepared by molecular beam epitaxy wherein at least one portion of the top layer is a two dimensional metal chalcogenide.

7. The process of claim 6 wherein the metal chalcogenide comprises InSe, $ZrS_2$, $TiSe_2$, $SnSe_2$, $SnS_2$, $NbSe_2$, $TaS_2$, $MoSe_2$, or $WSe_2$.

8. The process of claim 1 wherein the structure etched can be viewed simultaneously with its creation.

9. The process of claim 1 wherein the depth of the etched structure is controlled to a precision of $(0.0003 \times n)$ nanometer, wherein n is the number of layers etched.

10. The process of claim 1 wherein the substrate remains free of deformation or residue.

11. The process of claim 1 wherein the structure etched has a bottom surface that is atomically flat.

12. The etched structure resulting from the process of claim 1.

13. A method for determining small deviations from stoichiometry comprising scanning with an AFM a substrate area of known size, counting the resulting nucleation sites, and subtracting the number of nucleation sites from the number of atoms scanned.

* * * * *